United States Patent [19]

Bae

[11] Patent Number: 5,721,074
[45] Date of Patent: Feb. 24, 1998

[54] METHOD FOR FABRICATING A LIGHT EXPOSURE MASK COMPRISING THE USE OF A PROCESS DEFECT INSPECTION SYSTEM

[75] Inventor: Sang Man Bae, Kyoungki-do, Rep. of Korea

[73] Assignee: Hyundai Electronics Industries Co. Ltd., Rep. of Korea

[21] Appl. No.: 618,812

[22] Filed: Mar. 20, 1996

[30] Foreign Application Priority Data

Mar. 22, 1995 [KR] Rep. of Korea .................. 95-6126

[51] Int. Cl.$^6$ .................................................. G03F 9/00
[52] U.S. Cl. .................................... 430/5; 430/322
[58] Field of Search ...................... 430/5, 322, 324; 356/237

[56] References Cited

U.S. PATENT DOCUMENTS 4,751,169 6/1988 Behringer et al. ............... 430/296
4,805,123 2/1989 Specht et al. ..................... 356/394
4,985,927 1/1991 Norwood et al. ................. 382/8

*Primary Examiner*—S. Rosasco
*Attorney, Agent, or Firm*—Nath & Asociates; Gary M. Nath

[57] ABSTRACT

A method for fabricating a light exposure mask, including forming a pattern on a wafer by use of a primary light exposure mask formed with a light shield film pattern in accordance with a design rule, transmitting, to a data comparison system, data obtained after measuring the size of the pattern on the wafer by use of a process defect inspection system, comparing the data with the size of the light shield film pattern, thereby detecting a portion of the pattern on the wafer which has a difference from a critical size value of the light shield film pattern, determining, by use of a compensation equation, an amendment value for a portion of the light shield film pattern which corresponds to the detected portion of the pattern on the wafer, and forming a secondary light exposure mask, based on the amendment value.

10 Claims, 4 Drawing Sheets

METHOD FOR FABRICATING A LIGHT EXPOSURE MASK COMPRISING THE USE OF A PROCESS DEFECT INSPECTION SYSTEM

BACKGROUND OF THE INVENTION

1. Field of the Invention

The present invention relates to a method for fabricating a light exposure mask, and more particularly to a method for fabricating a light exposure mask, capable of entirely compensating the pattern fidelity of light exposure patterns by use of a process defect inspection system and a pattern compensation equation, thereby achieving the fabrication of highly integrated semiconductor devices.

2. Description of the Prior Art

Generally, the recent high integration trend of semiconductor devices has been greatly influenced by the development of techniques for forming photoresist film patterns with critical dimensions widely used as masks for etching or ion implanting processes in the fabrication of semiconductor devices.

In particular, a reduction in the wavelength of the light source has been made in order to improve the light resolution of the stepper used to form photoresist film patterns. For example, i-line steppers using a light source with a wavelength of about 365 nm exhibit a process resolution of about 0.5 μm. On the other hand, steppers using a light source adapted to generate KrF laser beams with a wavelength of about 248 nm or ArF laser beams with a wavelength of about 193 nm can achieve a pattern resolution up to about 0.30 μm for line/space patterns.

For recently developed 256M DRAMs according to a limited design rule, however, it is difficult to form the actually designed layout pattern image of a light exposure mask on a photoresist film formed over a wafer. This is because when light passes through a slit defined between neighboring chromium pattern portions of the mask, its diffraction rate varies depending on the size and shape of the slit. Such a phenomenon becomes severe where highly integrated semiconductor devices having a pattern with densely arranged pattern portions are fabricated.

Furthermore, the critical dimension of the pattern formed according to the pattern shape and size of the light exposure mask may vary even when the same pattern size is used. As a result, the yield and reliability of semiconductor devices is degraded.

In the case of light exposure masks according to a desired design rule, accordingly, there is a difference in the pattern size due to the diffraction effect (or the proximity effect) generated between neighboring pattern portions. For example, even in the case of the same light exposure mask, a difference in the critical dimension corresponding to about 0.1 μm is generated between the dense pattern region and sparse pattern region.

As another factor, there is a multiple level effect. That is, a degradation in the pattern such as notching occurs due to the systematic conditions, namely, condition differences among laminated films such as a reflection difference among the laminated films and a variation in topology.

It is also difficult to obtain uniform patterns due to the field dependent effect resulting from the non-uniformity among imaging systems equipped in the stepper, for example, the lens distortion.

The patterns may also have different sizes and shapes due to a development difference of photoresist resin films or a non-uniformity of PEB (Post Exposure Bake) heat treatment.

As mentioned above, the critical size of the pattern may vary depending on the critical shape and size of the mask pattern, the topology of the wafer, and the co-relationship among laminated films.

Although light exposure masks for forming patterns having a critical dimension of 0.5 μm can be used without amending their patterns because the variation in the critical size occurring in the fabrication of those patterns is insignificant, light exposure masks for forming patterns having a critical dimension of smaller than 0.5 μm absolutely require an amendment of their patterns.

Now, an example of a conventional method for fabricating a light exposure mask will be described in conjunction with FIG. 1.

FIG. 1 is a flow chart illustrating the conventional mask fabricating method.

In accordance with this method, a primary light exposure mask, which has a light shield film pattern formed in accordance with the designed layout drawing according to a design rule, is first formed, as shown in FIG. 1.

Using the primary light exposure mask, a semiconductor wafer (not shown) is then light-exposed with a pattern image by a 5:1 stepper, thereby forming a wafer pattern (not shown).

Thereafter, dimensions of particular wafer pattern portions for defining the active region, for example, pattern round diameters $d'_1$, $d'_2$ ... and pattern widths $r'_1$, $r'_2$ ... are manually measured by use of a measuring unit such as CD SEM.

Subsequently, the measured dimensions of the particular wafer pattern portions are manually compared with the designed size of the wafer pattern. The sizes of wafer pattern portions exhibiting a difference from the designed size are then amended. Based on the amended data, the designed layout drawing is amended. In accordance with the amended layout drawing, a secondary light exposure mask (not shown) is then fabricated so that it can be used.

As mentioned above, however, the conventional mask fabricating method involves various problems.

That is, the conventional method can obtain only the difference in critical dimension caused by some specific effects such as the proximity effect by the manual work because it uses the locally compensating method.

In accordance with the conventional method, it is impossible to manually amend the substantially overall size of semiconductor devices, such as 256M DRAMs, with the design rule of less than about 0.5 μm, for example, the size having a dimension of about 15 to 25 mm at each side. For this reason, such semiconductor devices are partially amended in size according to the conventional method. As a result, it is difficult to achieve a high integration of semiconductor devices. Furthermore, there is a degradation in the reliability of the operation and yield.

SUMMARY OF THE INVENTION

Therefore, an object of the invention is to solve the above-mentioned problems involved in the prior art and to provide a method for fabricating a light exposure mask, capable of entirely compensating a difference in the critical dimension of patterns caused by the proximity effect by use of a process defect inspection system and a pattern compensating equation, thereby not only improving the reliability of the operation and yield, but also achieving the fabrication of highly integrated semiconductor devices.

In accordance with the present invention, this object is accomplished by providing a method for fabricating a light exposure mask, comprising the steps of: forming a pattern on a wafer by use of a primary light exposure mask formed with a light shield film pattern in accordance with a design rule; transmitting, to a data comparison system, data obtained after measuring the size of the pattern on the wafer by use or a process defect inspection system; comparing the data with the size of the light shield film pattern, thereby detecting a portion of the pattern on the wafer which has a difference from a critical size value of the light shield film pattern; determining, by use of a compensation equation, an amendment value for a portion of the light shield film pattern which corresponds to the detected portion of the pattern on the wafers and forming a secondary light exposure mask, based on the amendment value.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
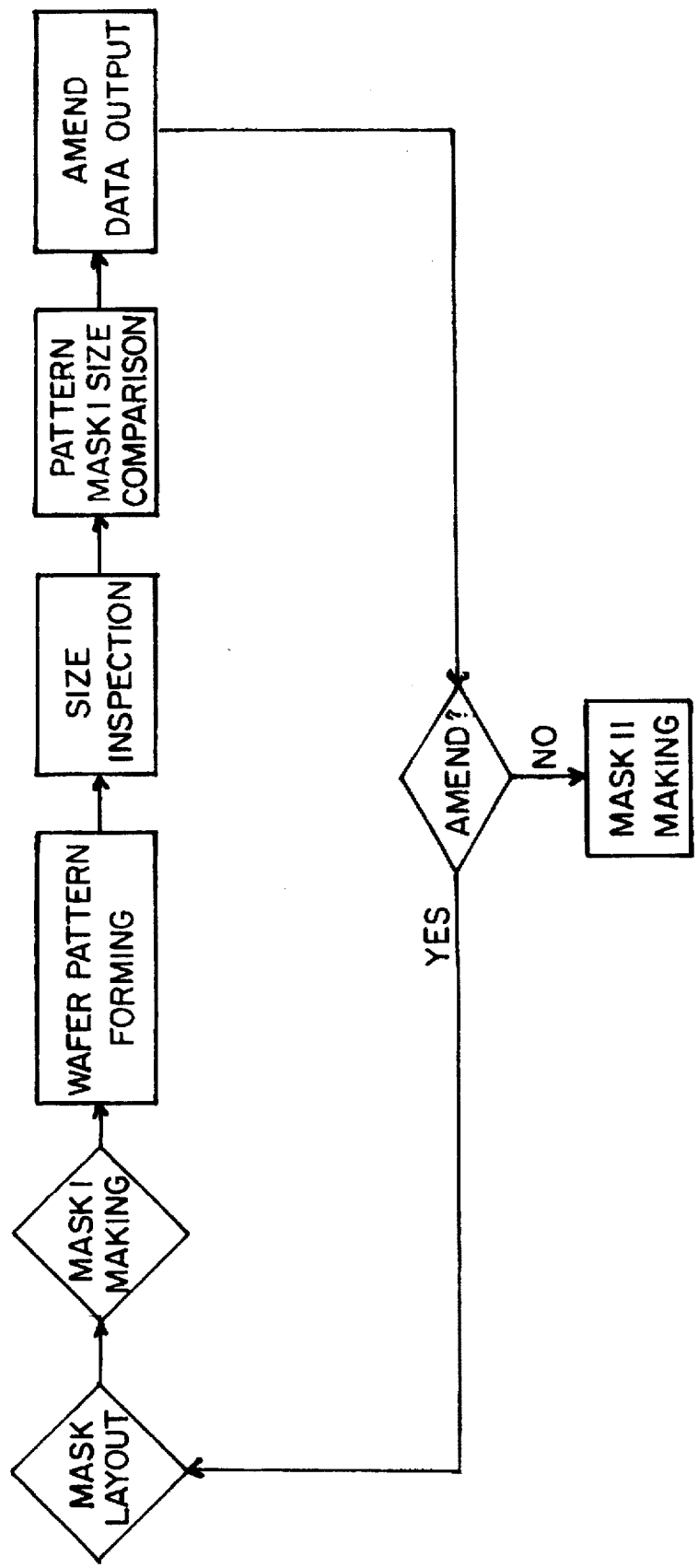
FIG. 1 is a flow chart illustrating a conventional method for fabricating a light exposure mask.
Figure 2A:
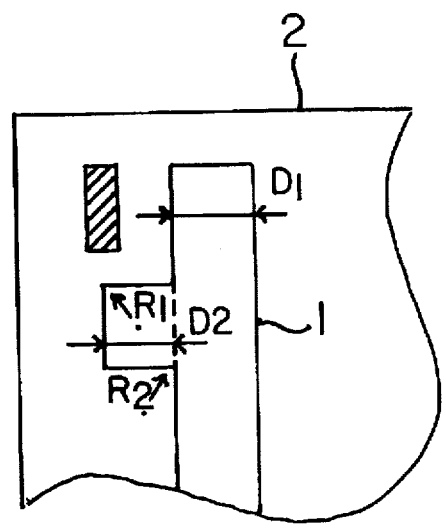
FIGS. 2A and 2B are layout views respectively illustrating light exposure masks fabricated in accordance with the present invention.
Figure 2B:
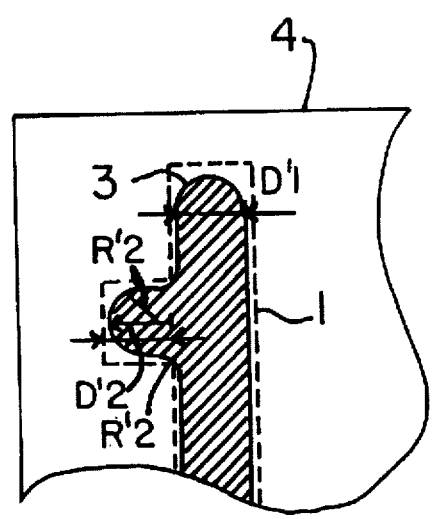
Figure 3:
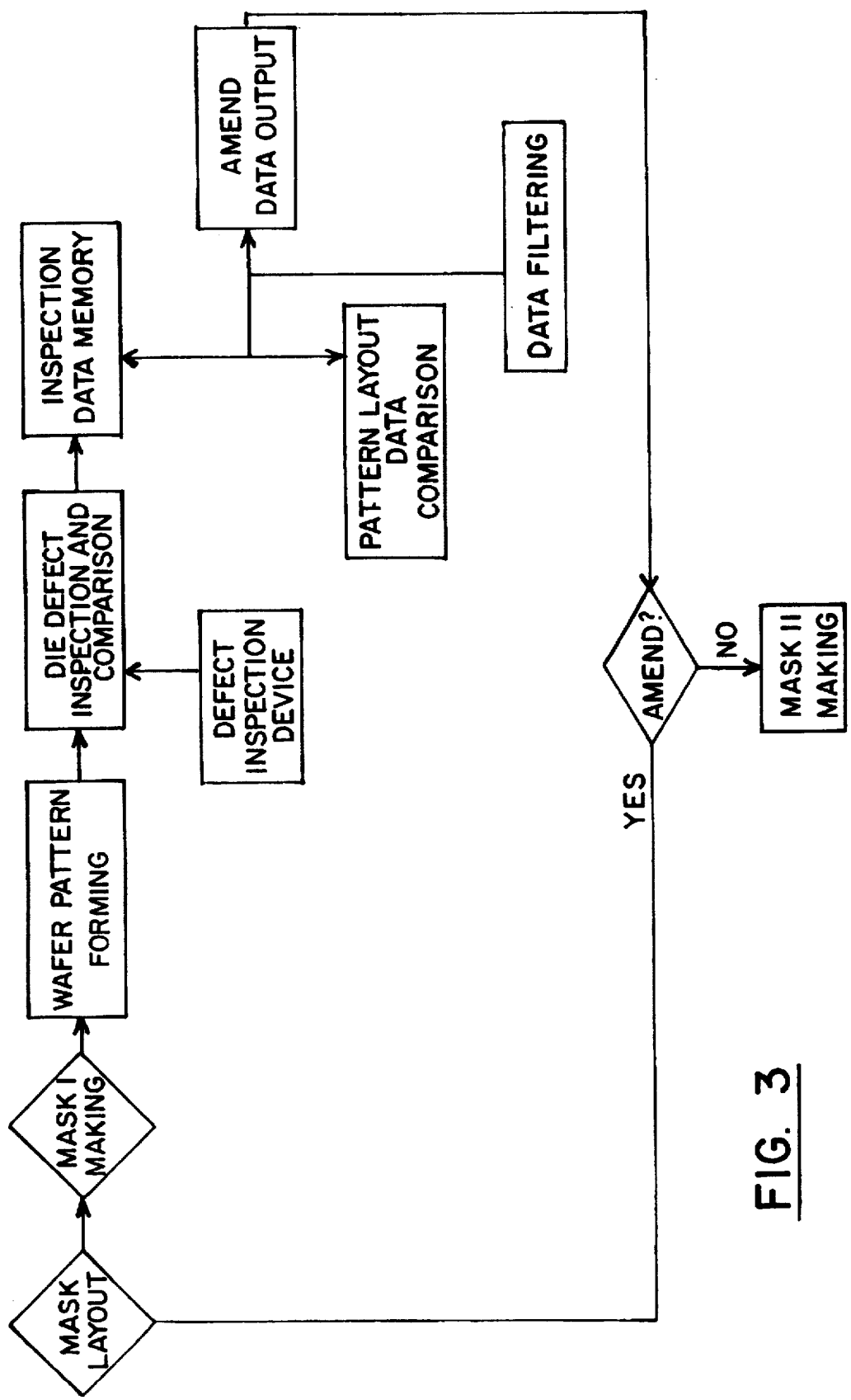
FIG. 3 is a flow chart illustrating a method for fabricating a light exposure mask in accordance with the present inventions and FIG. 4 is a layout view for explaining the pattern size inspecting method used in the fabrication of the light exposure mask in accordance with the present invention.

FIGS. 2A and 2B are layout views respectively illustrating light exposure masks fabricated in accordance with the present invention. On the other hand, FIG. 3 is a flow chart illustrating a method for fabricating a light exposure mask in accordance with the present invention.

In accordance with the present invention, a primary light exposure mask 2, which has a light shield film pattern 1 formed in accordance with the designed layout drawing according to a design rule, is first formed, as shown in FIG. 2A.

Using the primary light exposure mask 2, a semiconductor wafer (not shown) is then light-exposed with a pattern image by a 5:1 stepper, thereby forming a pattern 3. This pattern 3 is a photoresist film pattern or an etched pattern formed using the photoresist film pattern, as shown in FIG. 2B.

Preferably, the pattern 3 has a small thickness of, for example, about 0.5 μm or less in order to achieve an easy inspection of its critical size such as pattern round diameters $D'_1, D'_1 \ldots$ and pattern widths $R'_1, R'_2 \ldots$.

Thereafter, the pattern 3 is inspected using a process defect inspection system which uses a CD SEM and a light source adapted to generate electron beams or optical light beams, as shown in FIG. 3. In this case, the process defect inspection system uses a pattern-to-pattern comparison method or a pattern database-to-pattern comparison method.

These comparison methods can achieve the size comparison between patterns within a short period of, for example, several ten minutes to several hours. Although all dies are inspected in a zig-zag fashion in the conventional process defect inspection process, the process defect inspection system according to the present invention inspects only one clean die having no process defect.

In this case, the inspection is carried out for portions of the pattern 3 expected to have a large difference in its pattern size and shape.

The process defect inspection system inspects one die and detects a process defect of the pattern when the inspected difference in the critical size among the inspected pattern portions is beyond the range of about ±5% of the critical dimension value stored in the database for the design pattern.

After the detection, the process defect inspection system sends data about the position and size of the detected defect to a data comparison system.

The data comparison system then compares the inspected pattern with the light shield film pattern 1 at all portions. Based on the result of the comparison, the data comparison system sorts enlarged or reduced portions of the pattern.

Thereafter, the data comparison system obtains data about defects measured at each pattern portion by the inspection and comparison and then stores the measured defect position and variation in the pattern size in a memory device equipped therein.

Based on the data, a numerical layout amendment value is finally calculated through a filtering procedure and a procedure of analyzing the accuracy of the pattern recognition.

The data about the light shield film pattern 1 on the primary light exposure mask 2 is amended based on the amendment value. Based on the amended data, a secondary light exposure mask is then fabricated.

The calculation of the amendment value will now be described in detail in conjunction with FIG. 4.

Figure 4:
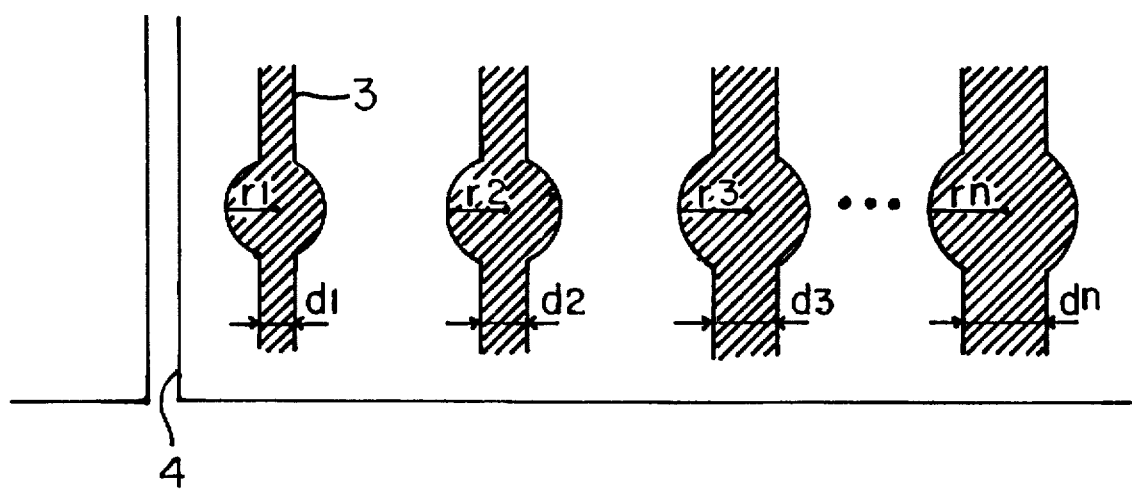

FIG. 4 is a layout view for explaining the pattern size inspecting method used in the fabrication of the light exposure mask in accordance with the present invention.

Although not shown, a sensor equipped in the process defect inspection system inspects defects on the pattern die while moving on the pattern die in a zig-zag fashion. In this case, the inspection is carried out by comparing the photoresist film pattern or etched pattern disposed at one side of the pattern die with another pattern disposed adjacent to the photoresist film pattern or by comparing each pattern image with the design drawing data stored in a separate memory device.

When the critical dimension of the light shield film pattern formed on the primary light exposure mask is compared, this comparison is carried out after the critical dimension is reduced in accordance with the reduction scale of the stepper.

Since adjacent patterns have different sizes due to the proximity effect, variations of the rounding diameter $r_n$ and pattern width $d_n$ caused by the rounding effect of the patterns are measured by selectively using one of the above-mentioned comparison methods.

Where the variations of the rounding diameter $r_n$ and pattern width $d_n$ are measured using the pattern-to-pattern comparison method, their amendment values $\delta r_n$ and $\delta d_n$ required for the mask (n is the number of inspected patterns) are calculated using the following mean compensation equations (1) and (2):

$$\delta r_n = \left( \frac{1}{n} \cdot \sum_{i=1}^{n} r_i \right) - r_n \tag{1}$$

-continued $$\delta d_n = \left( \frac{1}{n} \cdot \sum_{i=1}^{n} d_i \right) - d_n. \quad (2)$$

On the other hand, where the variations of the rounding diameter $r_n$ and pattern width $d_n$ are measured using the pattern database-to-pattern comparison method, that is, the one-to-one pattern comparison method, their amendment values $\delta r_n$ and $\delta d_n$ are calculated using the following mean compensation equations (3) and (4):

$$\delta r_n = (r_n)_{database} - (r'_n)_{wafer\ pattern\ data} \quad (3)$$

$$\delta d_n = (d_n)_{database} - (d'_n)_{wafer\ pattern\ data} \quad (4)$$

The final magnification amendment values $\delta r'_n$ and $\delta d'_n$ are calculated using the following equations (5) and (6):

$$\delta r'_n = K \cdot \delta r_n \quad (5)$$

$$\delta d'_n = K \cdot \delta d_n \quad (6)$$

where, K is a magnification factor and ranges from about 0.8 to about 1.5.

Meanwhile, when it is desired to partially inspect cells, the light exposure may be carried out in such a manner that no pattern is formed on cell portions requiring no inspection.

In order to amend notching caused by the astigmatism aberration, distortion or misalignment, and patterns erroneously formed, an over or under light exposure is carried out upon forming patterns such that the magnification factor K ranges from about 1 to about 1.5. In this case, it is possible to inspect patterns exhibiting a difference in critical size ranging within about ±5%.

This method can also be advantageously used for patterns expected to have pattern bridges or tails.

As apparent from the above description, the mask fabricating method according to the present invention provides the following effects.

That is, in accordance with the present invention, the pattern of the primary light exposure mask is compensated using amendment values obtained by inspecting and comparing the sizes of patterns by use of the process defect inspection system and pattern compensation equation. Accordingly, it is possible to easily fabricate a light exposure mask capable of amending the proximity effect, thereby forming an accurate photoresist film pattern on a wafer as in the design drawing.

Since the method of the present invention uses the existing process defect inspection system, it is possible to reduce the cost and effort required to fabricate light exposure masks. The reliability of the operation and yield are also improved.

In accordance with the method of the present invention, it is also possible to fabricate highly integrated semiconductor devices because a very small size difference between patterns can be amended by the pattern compensation equation.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a light exposure mask, comprising the steps of:

forming a pattern on a wafer by use of a primary light exposure mask formed with a light shield film pattern in accordance with a design rule;

measuring a size of a selected portion of said pattern using a process defect inspection system, and transmitting to a data comparison system, data regarding the size of the selected portion of the pattern;

comparing the data with the size of the light shield film pattern, thereby detecting a difference from a critical size value of the light shield film pattern;

determining, by use of a compensation equation and said difference, amendment values for a portion of the light shield film pattern which correspond to width and radius values of the selected portion of the pattern on the wafer; and forming a secondary light exposure mask, based on the amendment value.

2. The method in accordance with claim 1, wherein the pattern formed on the wafer is a photoresist film pattern or an image pattern formed by etching a photoresist film by use of a mask.

3. The method in accordance with claim 1, wherein the process defect inspection system carries out its inspection operation by comparing neighboring patterns disposed in a die having no process defect with each other or by comparing each pattern in the die with a database.

4. The method in accordance with claim 1, wherein the process defect inspection system recognizes a process defect of the pattern on the wafer when the difference in the critical size between the pattern on the wafer and the light shield film pattern on the primary light exposure mask is beyond the range of about ±5%, and obtains data about the position and size of the pattern having the process defect.

5. The method in accordance with claim 1, wherein the amendment value is determined using a pattern die-to-pattern die comparison method or a database-to-pattern die comparison method.

6. The method in accordance with claim 5, wherein when the amendment value is determined using the pattern die-to-pattern die comparison method, mean values ($\delta r_n$ and $\delta d_n$) of variations in the rounding diameter ($r_n$) and pattern width ($d_n$) caused, upon inspecting n patterns, by a rounding effect of each pattern are calculated using the following equations:

$$\delta r_n = \left( \frac{1}{n} \cdot \sum_{i=1}^{n} r_i \right) - r_n$$

$$\delta d_n = \left( \frac{1}{n} \cdot \sum_{i=1}^{n} d_i \right) - d_n$$

and final amendment values ($\delta r'_n$ and $\delta d'_n$) are calculated using the following equations:

$$\delta r'_n = K \cdot \delta r_n$$

$$\delta d'_n = K \cdot \delta d_n$$

where, K is a magnification factor.

7. The method in accordance with claim 6, wherein K ranges from about 0.8 to about 1.5.

8. The method in accordance with claim 5, wherein when the amendment value is determined using the database-to-pattern die comparison method, mean values ($\delta r_n$ and $\delta d_n$) of variations in the rounding diameter ($r_n$) and pattern width ($d_n$) caused, upon inspecting n patterns, by a rounding effect of each pattern are calculated using the following equations:

$$\delta r_n = (r_n)_{database} - (r'_n)_{wafer\ pattern\ data}$$

$$\delta d_n = (d_n)_{database} - (d'_n)_{wafer\ pattern\ data}$$

and final amendment values ($\delta r'_n$ and $\delta d'_n$) are calculated using the following equations:

$$\delta r'_n = K \cdot \delta d_n$$

$$\delta d'_n = K \cdot \delta d_n$$

where, K is a magnification factor.

9. The method in accordance with claim 8, wherein K ranges from about 0.8 to about 1.5.

10. The method in accordance with claim 1, wherein the step of forming the pattern on the wafer is carried out using an over or under light exposure method such that a variation in the critical size of the pattern ranges within the range of about ±5%.

* * * * *

UNITED STATES PATENT AND TRADEMARK OFFICE
CERTIFICATE OF CORRECTION

PATENT NO. : 5,721,074
DATED : February 24, 1998
INVENTOR(S) : Sang Man BAE

It is certified that error appears in the above-identified patent and that said Letters Patent is hereby corrected as shown below:

IN THE CLAIMS:

Please correct claim 8, col. 7, line 4, by replacing "$\delta d_n$" with --$\delta r_n$--.

Signed and Sealed this

Nineteenth Day of May, 1998

*Attest:*

BRUCE LEHMAN

*Attesting Officer*  Commissioner of Patents and Trademarks